(12) United States Patent
Kang et al.

(10) Patent No.: US 11,906,561 B2
(45) Date of Patent: Feb. 20, 2024

(54) DISPLAY MODULE INSPECTION DEVICE AND DISPLAY MODULE INSPECTION METHOD

(71) Applicant: SAMSUNG DISPLAY CO., LTD., Yongin-si (KR)

(72) Inventors: Bongil Kang, Namyangju-si (KR); Joo-Hyeon Jeong, Suwon-si (KR); Jun-Young Ko, Seoul (KR); Sangkook Kim, Cheonan-si (KR); Gayeon Yun, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 231 days.

(21) Appl. No.: 17/464,293

(22) Filed: Sep. 1, 2021

(65) Prior Publication Data

US 2022/0206049 A1   Jun. 30, 2022

(30) Foreign Application Priority Data

Dec. 28, 2020 (KR) .................. 10-2020-0185075

(51) Int. Cl.
G01R 27/26 (2006.01)
G01R 31/28 (2006.01)
G09G 3/00 (2006.01)
H10K 59/40 (2023.01)

(52) U.S. Cl.
CPC ..... *G01R 27/2605* (2013.01); *G01R 31/2825* (2013.01); *G09G 3/006* (2013.01); *H10K 59/40* (2023.02)

(58) Field of Classification Search
CPC ............ G01R 27/2605; G01R 31/2825; G01R 31/56; G09G 3/3233; G09G 3/006; H10K 59/40; H10K 71/70; H10K 71/00
See application file for complete search history.

(56) References Cited

U.S. PATENT DOCUMENTS

| 8,803,859 | B2 | 8/2014 | Cho et al. |
| 8,933,907 | B2 | 1/2015 | Hanauer et al. |
| 10,297,223 | B2 | 5/2019 | Mamba et al. |
| 10,984,691 | B2 * | 4/2021 | Siu ..................... G01R 31/2825 |
| 2020/0036386 | A1 | 1/2020 | Choi |

FOREIGN PATENT DOCUMENTS

| JP | 6745094 | 8/2020 |
| KR | 10-1228293 | 1/2013 |
| KR | 10-1849732 | 4/2018 |
| KR | 10-2020-0013319 | 2/2020 |

* cited by examiner

*Primary Examiner* — Amy He
(74) *Attorney, Agent, or Firm* — F. CHAU & ASSOCIATES, LLC

(57) ABSTRACT

An inspection device inspects a display for defects. The display includes a power supply, a circuit board having a stabilizer to stabilize the power supply, a display panel which is electrically connected to the circuit board and has a first electrode, and an input sensor which is disposed on the display panel and has a second electrode. The inspection logic measures a value of capacitance between the first electrode and the second electrode of the display, and includes a frequency setter that sets a driving frequency of the second electrode to a frequency in a predetermined range.

29 Claims, 13 Drawing Sheets

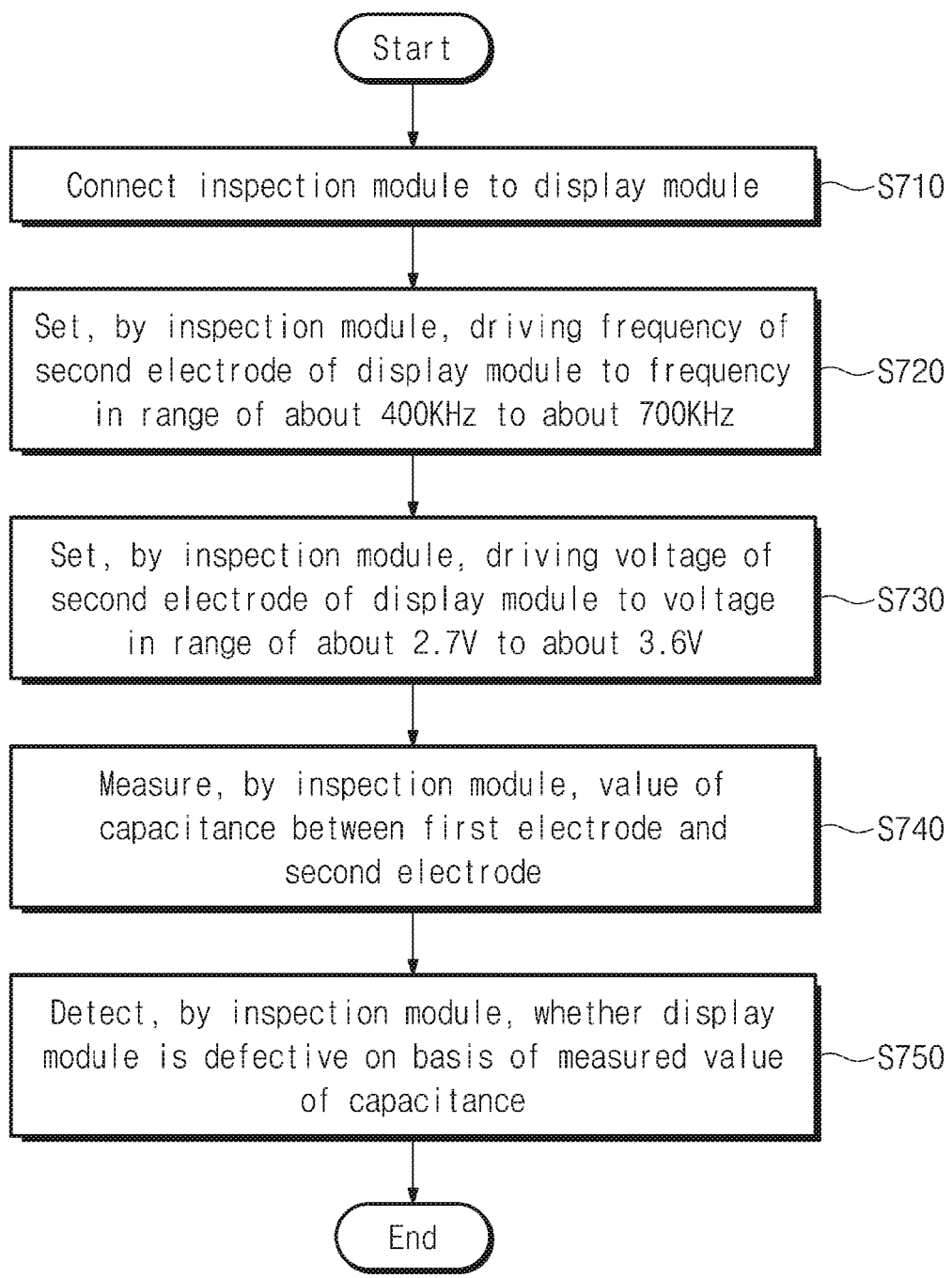

DISPLAY MODULE INSPECTION DEVICE AND DISPLAY MODULE INSPECTION METHOD

CROSS-REFERENCE TO RELATED APPLICATION

This U.S. non-provisional patent application claims priority under 35 U.S.C. § 119 of Korean Patent Application No. 10-2020-0185075, filed on Dec. 28, 2020, the entire contents of which are hereby incorporated by reference.

BACKGROUND

1. Field of the Disclosure

One or more embodiments disclosed herein relate to a display module inspection device and a display module inspection method.

2. Background of Related Art

A variety of electronic products have display modules. Examples include televisions, mobile phones, tablet computers, navigation devices, and game machines. The display modules include pixels and a driving circuit. The pixels output light to form images, and the driving circuit controls the pixels. Some display modules also include an input sensor that detects touch inputs created by a body part or object.

SUMMARY

One or more embodiments described herein provide a display module inspection device and a display module inspection method that detect defects in a display module.

These or other embodiments inspect a display module for defects by detecting whether a stabilization module attached to the display module is coupled.

In accordance with one or more embodiments of the inventive concept, an inspection device includes a display including a power supply, a circuit board having a stabilizer configured to stabilize the power supply, a display panel which is electrically connected to the circuit board and has a first electrode, and an input sensor which is disposed on the display panel and has a second electrode; and inspection logic configured to measure a value of capacitance between the first electrode and the second electrode of the display, wherein the inspection logic comprises a frequency setter configured to set a driving frequency of the second electrode to a frequency in a first predetermined range.

In accordance with one or more embodiments, an inspection device includes a display including a power supply, a circuit board having a stabilizer configured to stabilize the power supply, a display panel which is electrically connected to the circuit board and has a first electrode, and an input sensor which is disposed on the display panel and has a second electrode; and inspection logic configured to measure a value of capacitance between the first electrode and the second electrode of the display module, wherein the inspection logic is configured to set a driving voltage of the power supply to a voltage in a first predetermined range.

In accordance with one or more embodiments, an inspection method includes providing a display including a power supply, a circuit board having a stabilizer configured to stabilize the power supply, a display panel which is electrically connected to the circuit board and has a first electrode, and an input sensor which is disposed on the display panel and has a second electrode; setting, by inspection logic, a driving frequency of the second electrode to a frequency in a first predetermined range; and measuring, by the inspection logic, a value of capacitance between the first electrode and the second electrode.

In accordance with one or more embodiments, an apparatus includes inspection logic configured to determine existence of a defect in a display, the display including a power supply, a circuit board having a stabilizer configured to stabilize the power supply, a display panel which is electrically connected to the circuit board and has a first electrode, and an input sensor which is disposed on the display panel and has a second electrode, wherein the inspection logic comprises a frequency setter configured to set a driving frequency of the second electrode to a frequency in a first predetermined range, and wherein the inspection logic is configured to measure a value of capacitance between the first electrode and the second electrode of the display to determine existence of the defect.

BRIEF DESCRIPTION OF THE FIGURES

The accompanying drawings are included to provide a further understanding of the inventive concept, and are incorporated in and constitute a part of this specification. The drawings illustrate example embodiments of the inventive concept and, together with the description, serve to describe principles of the inventive concept. In the drawings:

FIG. 11 illustrates an embodiment of a display module inspection method.

DETAILED DESCRIPTION

Figure 1:
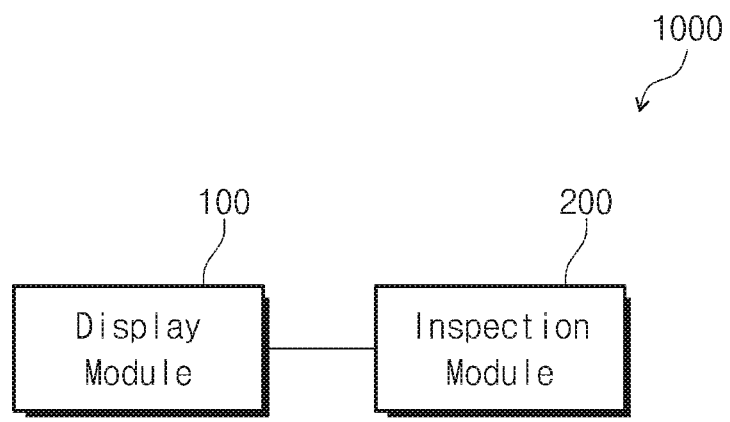
FIG. 1 illustrates an embodiment of a display module inspection device.

It will be understood that when an element or layer (or region, portion, and the like) is referred to as being "on", "connected to" or "coupled to" another element or layer, it can be directly on, connected or coupled to the other element or layer, or intervening elements or layers may be present. Like reference numerals refer to like elements throughout this specification. In the figures, the thicknesses, ratios and dimensions of elements are exaggerated for effective description of the technical contents. As used herein, the term "and/or" includes any combination of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention. As used herein, the singular forms, "a", "an" and "the" are intended to include the plural forms as well, unless the context clearly indicates otherwise.

Spatially relative terms, such as "beneath", "below", "lower", "above", and "upper", may be used herein for ease of description to describe one element or feature's relationship to another element(s) or feature(s) illustrated in the figures. The spatially relative terms are intended to encompass different orientations of the device in use or operation in addition to the orientation depicted in the figures. It will be further understood that the terms "include" or "have", when used in this specification, specify the presence of stated features, integers, steps, operations, elements, and/or components, but do not preclude the presence or addition of one or more other features, integers, steps, operations, elements, components, and/or groups thereof.

Unless otherwise defined, terms (including technical and scientific terms) used herein may have the meaning as commonly understood by one of ordinary skill in the art to which this invention belongs. It will be further understood that terms, such as those defined in commonly used dictionaries, should be interpreted as having a meaning consistent with their meaning in the context of the relevant art and will not be interpreted in an idealized or overly formal sense unless expressly so defined herein.

Hereinafter, the present invention will be explained in detail with reference to the accompanying drawings.

Figure 2:
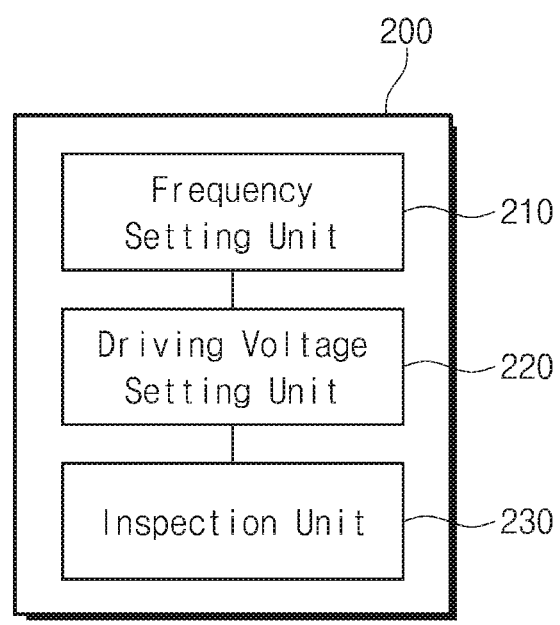
FIG. 2 illustrates an embodiment of an inspection module.

FIG. 1 is a block diagram illustrating a display module inspection device 1000 according to an embodiment of the inventive concept. FIG. 2 is a block diagram illustrating an inspection module 200 according to an embodiment of the inventive concept.

Referring to FIG. 1, the display module inspection device 1000 includes a display module 100 and an inspection module 200. The display module 100 displays an image and the inspection module 200 is electrically connected to the display module 100 and inspects the display module 100 for defects.

The display module 100 (or display) includes a display panel and an input sensor. For example, the display module 100 may include a power supply for supplying power, and a circuit board including a stabilization module (or stabilizer or filter) for removing noise from DC power and for generating a clean (or predetermined type of) signal. The pixels and/or driver circuits of the display panel are electrically connected to the circuit board, and the input sensor connected to the display panel. Example embodiments are discussed with reference to FIGS. 3 to 9.

The inspection module (or inspection logic) 200 may correspond to various types of inspection equipment for detecting whether the display module 100 is defective. For example, the inspection module 200 may correspond to inspection equipment that detects whether the stabilization module in the circuit board of the display module 100 is electrically connected. The inspection module 200 may variously set a driving frequency and/or a driving voltage to inspect the display module 100 for a defect. An example embodiment will be described with reference to FIG. 2.

Referring to FIG. 2, the inspection module 200 may include a frequency setting unit (or frequency setter) 210, a driving voltage setting unit (or driving voltage adjuster) 220, and an inspection unit (or inspection logic) 230.

The frequency setting unit 210 may set or adjust a driving frequency of the input sensor of the display module 100. The frequency setting unit 210 may set a driving frequency of touch electrodes of the input sensor for sensing a touch to a frequency in a predetermined range, e.g., a range of about 400 kHz to about 700 kHz, preferably to about 475 kHz.

The driving voltage setting unit 220 may set or adjust a voltage applied to the input sensor. For example, a driving voltage of the touch electrodes of the input sensor connected to the display panel may be set to a voltage in a predetermined range, e.g., a range of about 2.7 V to about 3.6 V, preferably to about 3.6 V. In an embodiment, the driving voltage setting unit 220 may set a driving voltage of the power supply. For example, the driving voltage setting unit 220 may set the driving voltage of the power supply to a voltage in a predetermined range, e.g., a range of about −1.1 V to about −4.1 V.

In one embodiment, the inspection unit 230 may inspect the display module 100 for a defect under conditions of the set driving frequency and the set driving voltage. For example, the inspection unit 230 may measure the value of capacitance applied between the display panel and the input sensor. The inspection unit 230 may determine whether the stabilization module (or stabilizer or filter) is properly coupled on the circuit board in the display module 100 based on the capacitance value. Examples embodiments are described with reference to FIGS. 10A and 10B.

Figure 3:
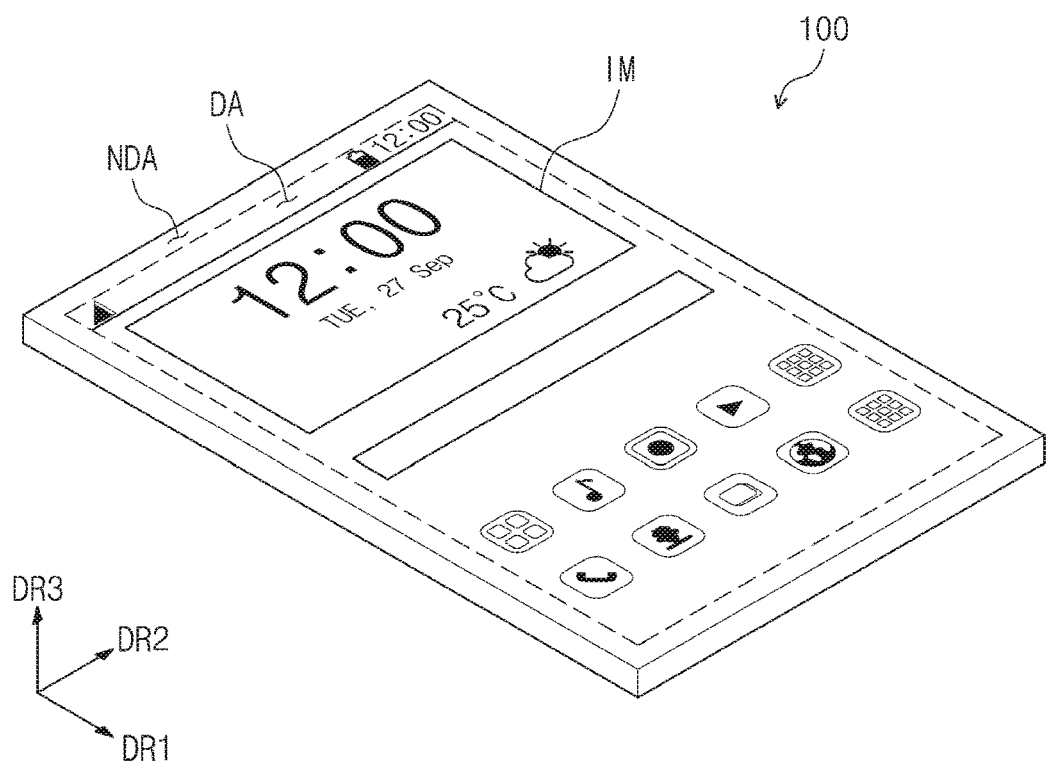
FIG. 3 illustrates an embodiment of a display module.
Figure 4:
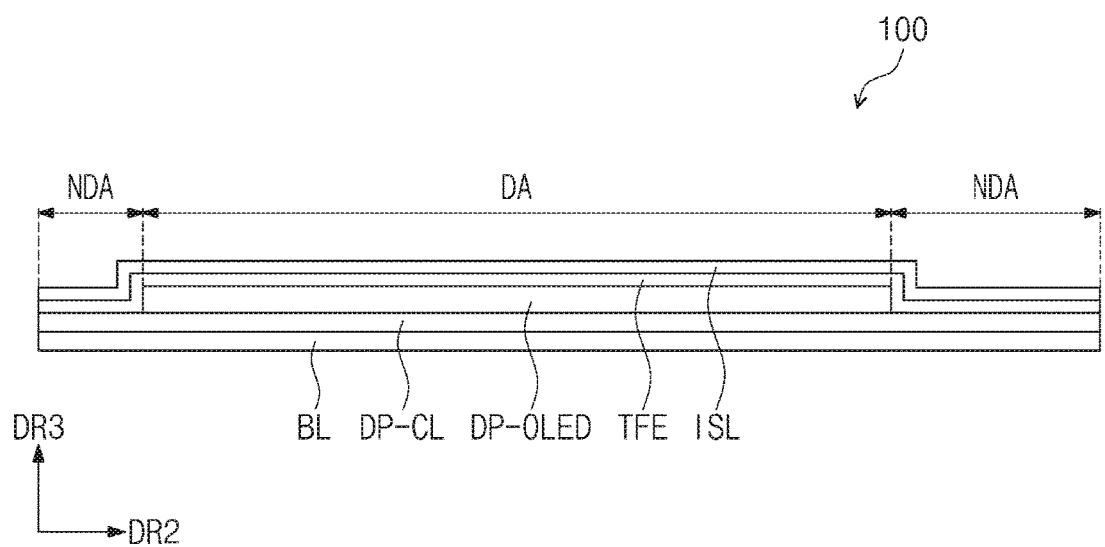
FIG. 4 illustrates an embodiment of a display module.

FIG. 3 is a perspective view illustrating the display module 100 according to an embodiment of the inventive concept. FIG. 4 is a cross-sectional view illustrating the display module 100 according to an embodiment of the inventive concept.

As illustrated in FIG. 3, a display surface on which an image IM is displayed may be parallel to a plane defined by a first direction axis DR1 and a second direction axis DR2. A normal direction of the display surface (e.g., a thickness direction of the display module 100) is indicated by a third direction axis DR3. A front surface (or a top surface) and a rear surface (or a bottom surface) may be distinguished by the third direction axis DR3. However, directions indicated by the first to third direction axes DR1 to DR3 are relative and may be converted to different directions. Hereinafter, first to third directions are directions respectively indicated by the first to third direction axes DR1 to DR3 and are denoted by like reference numerals.

The display module 100 in this embodiment corresponds to a mobile phone, but the display module 100 may correspond to a different type of device in another embodiment. For example, in an embodiment of the inventive concept, the display module 100 may be applied to large-sized electronic devices (e.g., televisions, monitors, etc.) or medium- to small-sized electronic devices (e.g., tablets, car navigation devices, game machines, smart watches, etc.).

The display surface includes a display area DA that displays the image IM and a non-display area NDA that is adjacent to the display area DA and is an area in which an image is not displayed. FIG. 3 illustrates icon images as an example of the image IM. The display area DA may have a predetermined shape, e.g., a quadrangular shape. The non-display area NDA may at least partially surround the display area DA. However, the shapes of the display area DA and the non-display area NDA are not limited thereto and may be different in other embodiments.

FIG. 4 illustrates an embodiment of a cross-section of the display module 100, as defined by the second direction axis DR2 and the third direction axis DR3.

As illustrated in FIG. 4, the display module 100 includes a display panel DP and an input sensor ISL (or an input sensor layer ISL). The display panel DP generates an image, and the input sensor ISL obtains coordinate information of an external input (a touch event). Although not illustrated separately, a protective member disposed on a bottom surface of the display panel DP, and an anti-reflection member and/or a window member disposed on a top surface of the input sensor ISL may be further included in the display module 100 according to an embodiment of the inventive concept.

The display panel DP may be a light emitting display panel and is not particularly limited. For example, the display panel DP may be an organic light emitting display panel or a quantum dot light emitting display panel. A light emitting layer of the organic light emitting display panel includes an organic light emitting material. A light emitting layer of the quantum dot light emitting display panel includes a quantum dot and a quantum rod. Hereinafter, the display panel DP is described as the organic light emitting display panel.

The display panel DP includes a base layer BL, and a circuit element layer DP-CL, a display element layer DP-OLED, and a thin film encapsulation layer TFE that are disposed on the base layer BL. One or more functional layers (e.g., anti-reflection layer, refractive index adjustment layer, etc.) may be further included in the display panel DP in some embodiments.

The base layer BL may include a flexible film. The base layer BL may include a plastic substrate, a glass substrate, a metal substrate, an organic/inorganic composite material substrate, or the like. In one embodiment, the display area DA and the non-display area NDA described with reference to FIG. 3 may be equally defined in the base layer BL.

The circuit element layer DP-CL includes at least one intermediate insulating layer and a circuit element. The intermediate insulating layer includes at least one intermediate inorganic film and at least one intermediate organic film. The circuit element includes signal lines, a pixel driving circuit, and/or other features. In one embodiment, a plurality of pixel driving circuits may be provided. The circuit element layer DP-CL may be formed through a process of forming an insulating layer by coating, deposition, and the like, and a process of patterning a conductive layer and/or a semiconductor layer by a photolithography process.

The display element layer DP-OLED may include organic light emitting diodes. The display element layer DP-OLED may further include an organic film such as a pixel defining film.

The thin film encapsulation layer TFE seals the display element layer DP-OLED. The thin film encapsulation layer TFE includes at least one inorganic film (hereinafter referred to as an encapsulation inorganic film). The thin film encapsulation layer TFE may further include at least one organic film (hereinafter referred to as an encapsulation organic film). The encapsulation inorganic film protects the display element layer DP-OLED from moisture/oxygen. The encapsulation organic film protects the display element layer DP-OLED from foreign matter such as dust particles. The encapsulation inorganic film may include a silicon nitride layer, a silicon oxynitride layer and a silicon oxide layer, a titanium oxide layer, an aluminum oxide layer, or the like. The encapsulation organic film may include an acrylate-based organic layer but is not limited thereto.

The input sensor ISL may be directly disposed on a base surface the display panel DP provides. In one embodiment, "directly disposed" may mean being formed by a continuous process and may exclude attaching using a separate adhesive layer. The base surface may be a top surface of the thin film encapsulation layer TFE or may be a top surface of another functional layer disposed on the thin film encapsulation layer TFE. The base surface is not particularly limited, and an uppermost surface of the display panel DP formed by a continuous process suffices for the base surface. A base substrate of a touch panel is omitted because the input sensor ISL is directly disposed on the base surface provided by the display panel DP, so that the thickness of the display module 100 is reduced.

The input sensor ISL may have a multilayer structure. The input sensor ISL may include a single-layer or multilayer conductive layer. The input sensor ISL may include at least one insulating layer.

The input sensor ISL may sense an external input in, for example, a capacitive method. In an embodiment of the inventive concept, the operation method of the input sensor ISL is not particularly limited, and the input sensor ISL may also sense an external input in an electromagnetic induction method or a pressure sensing method.

Figure 5:
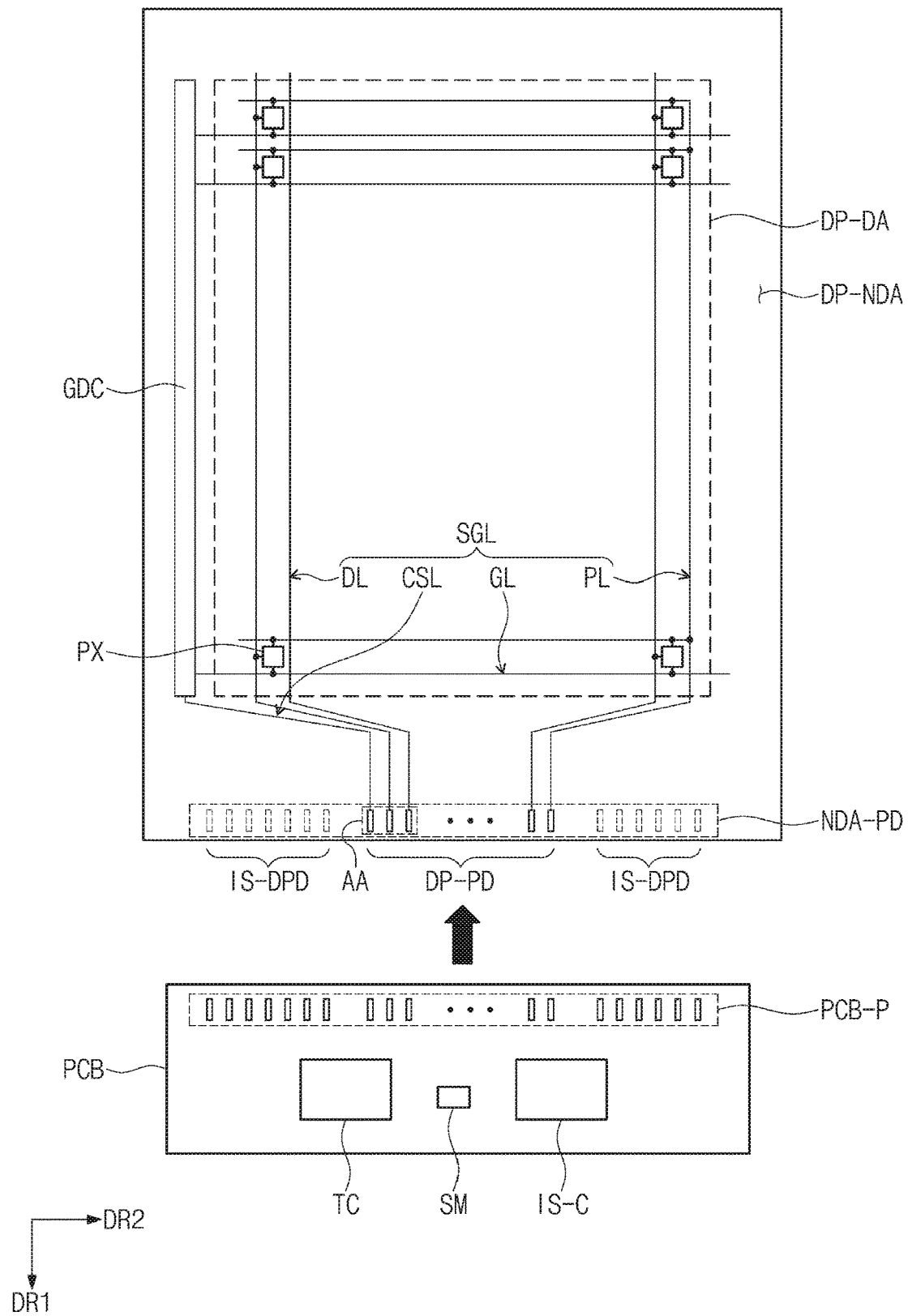
FIG. 5 illustrates an embodiment of a display panel.
Figure 6:
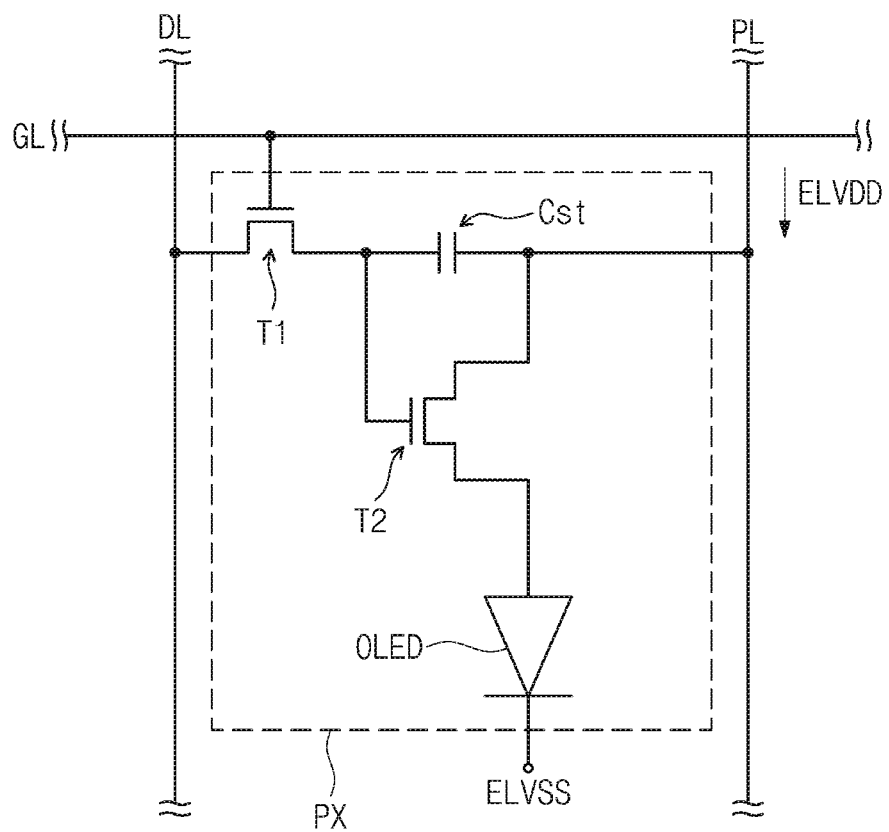
FIG. 6 illustrates an embodiment of a pixel.
Figure 7:
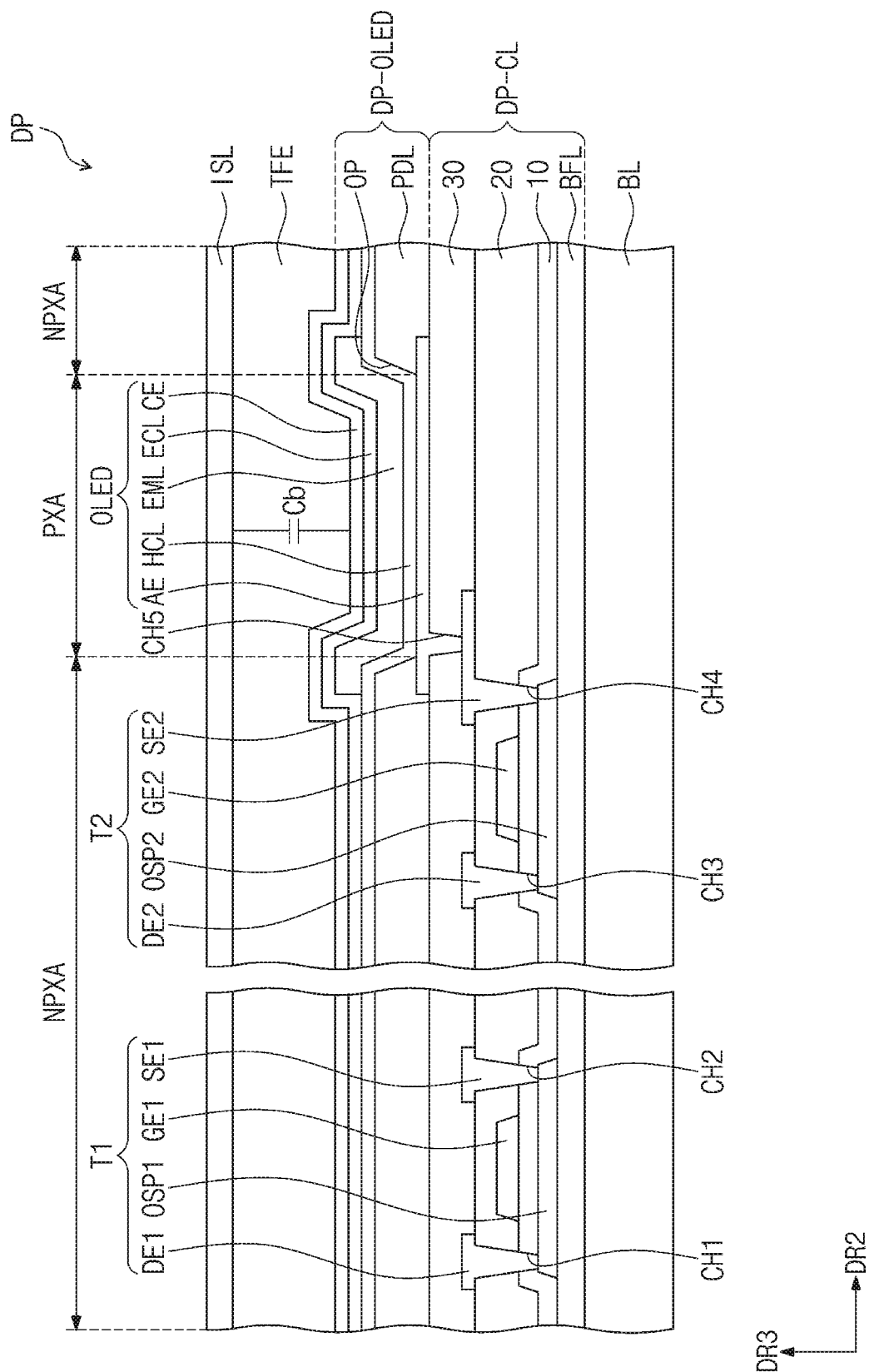
FIG. 7 illustrates an embodiment of a display panel.

FIG. 5 is a plan view of the display panel DP according to an embodiment of the inventive concept. FIG. 6 is an equivalent circuit diagram of a pixel PX, which may be representative of the pixels in display panel DP according to an embodiment of the inventive concept. FIG. 7 is an enlarged cross-sectional view of the display panel DP according to an embodiment of the inventive concept.

As illustrated in FIG. 5, the display panel DP includes a display area DP-DA and a non-display area DP-NDA when viewed in a plane. In one embodiment, the non-display area DP-NDA may be defined along the edge of the display area DP-DA. The display area DP-DA and the non-display area DP-NDA of the display panel DP may respectively correspond to the display area DA and the non-display area NDA of the display module 100 illustrated in FIG. 3.

The display panel DP may include a driving circuit GDC, a plurality of signal lines SGL (hereinafter referred to as signal lines SGL), a plurality of signal pads DP-PD (hereinafter referred to as signal pads DP-PD), and the plurality of pixels PX (pixels PX). The pixels PX are arranged in the display area DP-DA. Each of the pixels PX includes, for example, a corresponding organic light emitting diode of the organic light emitting diodes and a pixel driving circuit connected thereto of the pixel driving circuits. The driving circuit GDC, the signal lines SGL, the signal pads DP-PD, and the pixel driving circuit may be included in the circuit element layer DP-CL illustrated in FIG. 4.

The driving circuit GDC may include a scan driving circuit that generates a plurality of scan signals (hereinafter referred to as scan signals) and that sequentially outputs the scan signals to a plurality of scan lines GL (hereinafter referred to as scan lines GL), embodiments of which are to be described later. The scan driving circuit may output another control signal to the pixel driving circuit of each of the pixels PX.

The scan driving circuit may include a plurality of thin film transistors formed, for example, through substantially the same process as the pixel driving circuits of the pixels PX. Examples of the process include a low temperature polycrystalline silicon (LTPS) process and a low temperature polycrystalline oxide (LTPO) process.

The signal lines SGL include the scan lines GL, data lines DL, a power line PL, and a control signal line CSL. Each of the scan lines GL is connected to corresponding pixels PX among the pixels PX. Each of the data lines DL is connected to corresponding pixels PX among the pixels PX. The power line PL is connected to the pixels PX. The control signal line CSL may provide control signals to the scan driving circuit.

The signal lines SGL overlap the display area DP-DA and the non-display area DP-NDA. The signal lines SGL may include a pad part and a line part. In one embodiment, a plurality of pad parts may be provided. The line part overlaps the display area DP-DA and the non-display area DP-NDA. The pad parts are connected to an end of the line part and are disposed in the non-display area DP-NDA. Each of the pad parts may overlap a corresponding signal pad among the signal pads DP-PD. Example embodiments will be described below. An area in which the signal pads DP-PD are disposed of the non-display area DP-NDA may be a pad area NDA-PD.

The line part connected to the pixels PX substantially constitutes most of the signal lines SGL. The line part is connected to transistors T1 and T2 (e.g., see FIG. 7) of the pixel PX. The line part may have a single-layer/multilayer structure, and may be a single body or may include two or more portions. The two or more portions may be disposed on different layers and, for example, may be connected to each other through a contact hole penetrating an insulating layer disposed between the two or more portions.

The display panel DP may further include dummy pads IS-DPD disposed in the pad area NDA-PD. Because they may be formed through substantially the same process as the signal lines SGL, the dummy pads IS-DPD may be disposed on the same layer as the signal lines SGL. In another embodiment, they may be formed by different processes and/or may be disposed on different layers. The dummy pads IS-DPD may be selectively provided in a display device DD including the input sensor layer ISL of FIG. 4.

The dummy pads IS-DPD may overlap a pad part of signal lines in the input sensor layer ISL (e.g., see FIG. 4). The dummy pads IS-DPD may be floating electrodes. The dummy pads IS-DPD may be electrically insulated from the signal lines SGL of the display panel. A detailed description thereof will be given later.

FIG. 5 further illustrates a circuit board PCB electrically connected to the display panel DP. The circuit board PCB may be a rigid circuit board or a flexible circuit board directly coupled to the display panel DP or connected to the display panel DP through another circuit board. The display panel DP may be connected to the power supply through the circuit board PCB. The power supply supplies power for driving the display panel DP.

A timing control circuit TC, for controlling an operation of the display panel DP, may be disposed on the circuit board PCB. In addition, an input sensing circuit IS-C for controlling the input sensor layer ISL may be disposed on the circuit board PCB. Each of the timing control circuit TC and the input sensing circuit IS-C may be mounted on the circuit board PCB in the form of an integrated circuit chip. In an embodiment of the inventive concept, the timing control circuit TC and the input sensing circuit IS-C may be mounted on the circuit board PCB in the form of a single integrated circuit chip. The circuit board PCB may include circuit board pads PCB-P electrically connected to the display panel DP. Signal lines, which connect the circuit board pads PCB-P and the timing control circuit TC and/or the input sensing circuit IS-C, are further included in the circuit board PCB.

The circuit board PCB may include a stabilization module SM for stabilizing the power supply. The stabilization module SM may prevent a luminance defect of the display panel and/or a touch defect of the input sensor connected to the display panel by removing noise from and stabilizing DC power. The stabilization module SM may be disposed on the circuit board PCB and, for example, may be mounted on the circuit board PCB in the form of an integrated circuit chip separate from the timing control circuit TC and the input sensing circuit IS-C. The stabilization module SM may be or provide a stabilization capacitance.

FIG. 6 exemplarily illustrates an embodiment of a representative pixel PX connected to one scan line GL of the scan lines GL, one data line DL of the data lines DL, and the power line PL. The configuration of the pixel PX may be different in another embodiment.

The pixel PX includes an organic light emitting diode OLED, which may be a top-emitting light emitting diode or a bottom-emitting light emitting diode. The pixel PX also includes a first transistor (or switching transistor) T1, a second transistor (or driving transistor) T2, and a capacitor Cst as components constituting a pixel driving circuit for driving the organic light emitting diode OLED. A first power voltage ELVDD is provided to the second transistor T2, and a second power voltage ELVSS is provided to the organic light emitting diode OLED. The second power voltage ELVSS may be different from (e.g., lower than) the first power voltage ELVDD. The power supply may provide the second power voltage ELVSS and an embodiment of the inventive concept will be described in greater detail below.

The first transistor T1 outputs a data signal applied to the data line DL in response to a scan signal applied to the scan line GL. The capacitor Cst is charged to a voltage corresponding to the data signal received from the first transistor T1.

The second transistor T2 is connected to the organic light emitting diode OLED and controls a driving current flowing through the organic light emitting diode OLED in response to a quantity of electric charge stored in the capacitor Cst.

FIG. 7 is a partial cross-sectional view of the display panel DP, corresponding to the equivalent circuit illustrated in FIG. 6, according to an embodiment. The circuit element layer DP-CL, the display element layer DP-OLED, and the thin film encapsulation layer TFB are sequentially disposed on the base layer BL.

The circuit element layer DP-CL includes one or more inorganic films, at least one organic film, and the circuit element. The circuit element layer DP-CL may include a buffer film BFL, a first intermediate inorganic film 10, and a second intermediate inorganic film 20 which are the inorganic films, and an intermediate organic film 30 which is the organic film. The inorganic films may include, for example, silicon nitride, silicon oxynitride, silicon oxide, and the like. The organic film may include, for example, at least one of acrylate-based resin, methacrylate-based resin, polyisoprene, vinyl-based resin, epoxy-based resin, urethane-based resin, cellulose-based resin, siloxane-based resin, polyimide-based resin, polyamide-based resin, or perylene-based resin. The circuit element includes conductive patterns and/or semiconductor patterns.

The buffer film BFL improves bonding force between the base layer BL and the conductive patterns or the semiconductor patterns. In one embodiment, a barrier layer for preventing foreign matter from being introduced may be further disposed on a top surface of the base layer BL. The buffer film BFL and the barrier layer may be selectively disposed/omitted.

A semiconductor pattern OSP1 (hereinafter referred to as a first semiconductor pattern OSP1) of the first transistor T1 and a semiconductor pattern OSP2 (hereinafter referred to as a second semiconductor pattern OSP2) of the second transistor T2 are disposed on the buffer film BFL. The first semiconductor pattern OSP1 and the second semiconductor pattern OSP2 may be formed from a material selected, for example, from amorphous silicon, polysilicon, and a metal oxide semiconductor.

The first intermediate inorganic film 10 is disposed on the first semiconductor pattern OSP1 and the second semiconductor pattern OSP2. A control electrode GE1 (hereinafter referred to as a first control electrode GE1) of the first transistor T1 and a control electrode GE2 (hereinafter referred to as a second control electrode GE2) of the second transistor T2 are disposed on the first intermediate inorganic film 10. The first control electrode GE1 and the second control electrode GE2 may be manufactured, for example, by substantially the same or a different photolithography process as the scan lines GL (e.g., see FIG. 5).

The second intermediate inorganic film 20 covering the first control electrode GE1, and the second control electrode GE2 is disposed on the first intermediate inorganic film 10. Disposed on the second intermediate inorganic film 20 are an input electrode DE1 (hereinafter referred to as a first input electrode DE1) of the first transistor T1, an output electrode SE1 (hereinafter referred to as a first output electrode SE1) of the first transistor T1, an input electrode DE2 (hereinafter referred to as a second input electrode DE2) of the second transistor T2, and an output electrode SE2 (hereinafter referred to as a second output electrode SE2) of the second transistor T2.

The first input electrode DE1 and the first output electrode SE1 are connected to the first semiconductor pattern OSP1 through a first through-hole CH1 and a second through-hole CH2, respectively, which holes penetrate the first intermediate inorganic film 10 and the second intermediate inorganic film 20. The second input electrode DE2 and the second output electrode SE2 are connected to the second semiconductor pattern OSP2 through a third through-hole CH3 and a fourth through-hole CH4, respectively, which holes penetrate the first intermediate inorganic film 10 and the second intermediate inorganic film 20. In one embodiment of the inventive concept, one or both of the first transistor T1 and the second transistor T2 may be modified and implemented in a bottom gate structure.

The intermediate organic film 30 covering the first input electrode DE1, the second input electrode DE2, the first output electrode SE1, and the second output electrode SE2 is disposed on the second intermediate inorganic film 20. The intermediate organic film may provide a flat surface.

The display element layer DP-OLED is disposed on the intermediate organic film 30 and may include a pixel defining film PDL and the organic light emitting diode OLED. The pixel defining film PDL may include an organic material as the intermediate organic film 30 does. A first electrode AE is disposed on the intermediate organic film 30 and is connected to the second output electrode SE2 through a fifth through-hole CH5 penetrating the intermediate organic film 30. An opening OP is in the pixel defining film PDL to expose at least a portion of the first electrode AE.

The pixel PX may be disposed in a pixel area when viewed in a plane. The pixel area may include a light emitting area PXA and a non-light emitting area NPXA adjacent to the light emitting area PXA. The non-light emitting area NPXA may surround the light emitting area PXA. In this embodiment, the light emitting area PXA may correspond to the portion of the first electrode AE exposed by the opening OP.

A hole control layer HCL may be disposed in common in the light emitting area PXA and the non-light emitting area NPXA. In one embodiment, a common layer such as the hole control layer HCL may be formed in common in the plurality of pixels PX (e.g., see FIG. 5).

A light emitting layer EML is disposed on the hole control layer HCL in an area corresponding to the opening OP. In one embodiment, a plurality of light emitting layers EML may be provided. Accordingly, the light emitting layers EML may be separately formed in each of the plurality of pixels PX. The light emitting layer EML may include an organic material and/or an inorganic material. In this embodiment, the light emitting layer EML is illustrated as being patterned. In one embodiment, the light emitting layer EML may be disposed in common in the plurality of pixels PX. In this case, the light emitting layer EML may generate predetermined light, e.g., white light. In addition, the light emitting layer EML may have a multilayer structure.

An electron control layer ECL is disposed on the light emitting layer EML. In one embodiment, the electron control layer ECL may be formed in common in the plurality of pixels PX (e.g., see FIG. 5).

A second electrode CE is disposed on the electron control layer ECL in common in the plurality of pixels PX.

The thin film encapsulation layer TFE is disposed on the second electrode CE in common in the plurality of pixels PX. In this embodiment, the thin film encapsulation layer TFE directly covers the second electrode CE. In an embodiment of the inventive concept, a capping layer covering the second electrode CE may be further disposed between the thin film encapsulation layer TFE and the second electrode CE. In this case, the thin film encapsulation layer TFE may directly cover the capping layer.

The input sensor layer ISL may be disposed on the thin film encapsulation layer TFE. The input sensor layer ISL may include the touch electrodes, and capacitance Cb may be formed between the touch electrodes of the input sensor layer ISL and the second electrode CE of the display panel DP. The input sensor may sense an external input on the basis of a value of the capacitance Cb between the input sensor layer ISL and the display panel DP.

Figure 8:
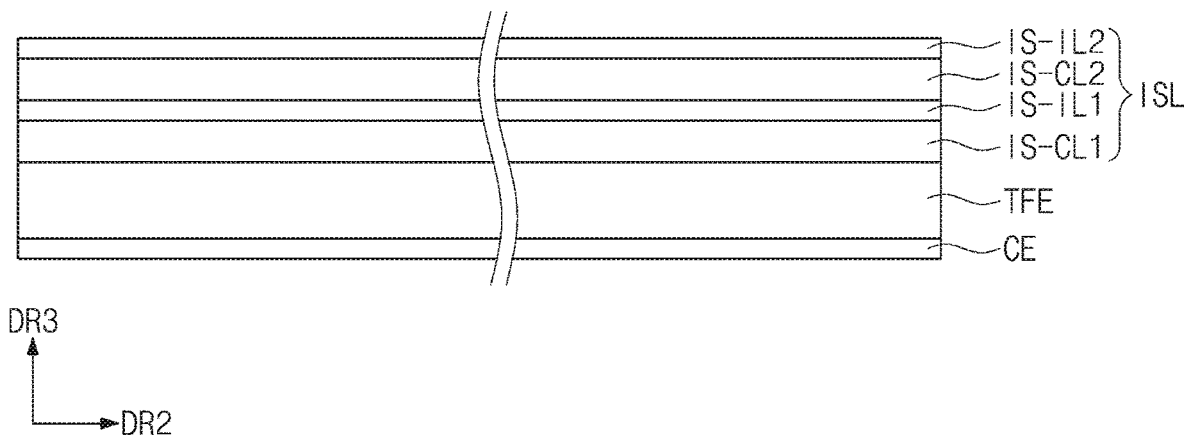
FIG. 8 illustrates an embodiment of an input sensor.
Figure 9:
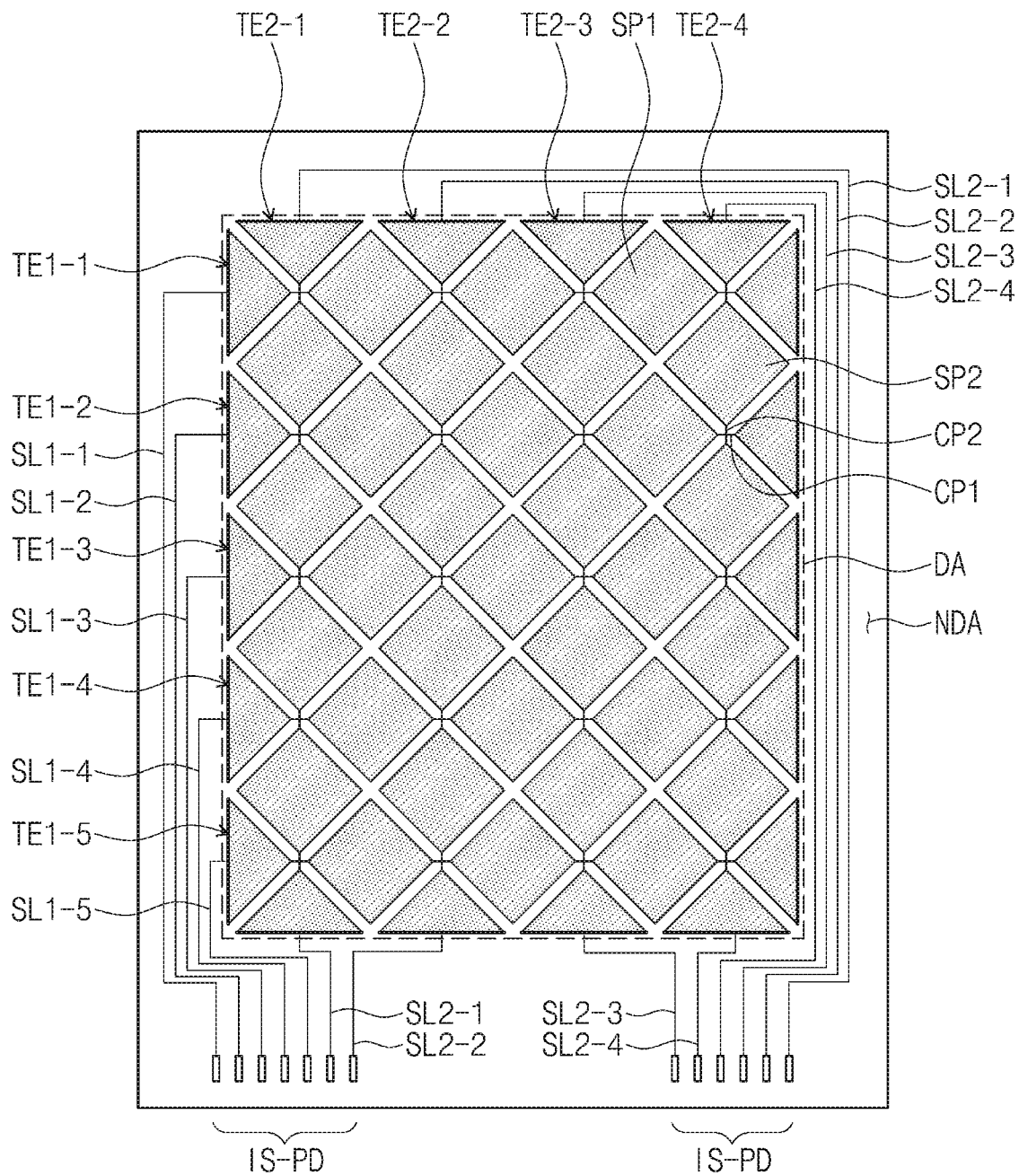
FIG. 9 illustrates an embodiment of an input sensor.

FIG. 8 is a cross-sectional view of the input sensor ISL according to an embodiment of the inventive concept. FIG. 9 is a plan view of the input sensor ISL according to an embodiment of the inventive concept.

As illustrated in FIG. 8, the input sensor ISL includes a first conductive layer IS-CL1, a first insulating layer IS-IL1 (hereinafter referred to as a first touch insulating layer IS-IL1), a second conductive layer IS-CL2, and a second insulating layer IS-IL2 (hereinafter referred to as a second touch insulating layer IS-IL2). In this embodiment, the first conductive layer IS-CL1 is directly disposed on the thin film encapsulation layer TFE. In one embodiment, another inorganic or organic layer may be disposed between the first conductive layer IS-CL1 and the thin film encapsulation layer TFE. In one embodiment of the inventive concept, the second touch insulating layer IS-IL2 may be omitted, and an optical member, an adhesive layer, and/or another feature may instead perform a protective function of the second touch insulating layer IS-IL2.

Each of the first conductive layer IS-CL1 and the second conductive layer IS-CL2 may have a single-layer structure or a multilayer structure laminated along the third direction axis DR3. The conductive layer of the single-layer structure may include a metal layer or a transparent conductive layer. The metal layer may include, for example, molybdenum, silver, titanium, copper, aluminum, and an alloy thereof. The transparent conductive layer may include transparent conductive oxide, e.g., indium tin oxide (ITO), indium zinc oxide (IZO), zinc oxide (ZnO), or indium tin zinc oxide (ITZO). In addition, the transparent conductive layer may include PEDOT, metal nanowires, and/or graphene.

The conductive layer of the multilayer structure may include multiple metal layers which may have, for example, a multiple layer (e.g., three-layer) structure of titanium/aluminum/titanium. The conductive layer of the multilayer structure may include a single metal layer and a transparent conductive layer. The conductive layer of the multilayer structure may include multiple metal layers and a transparent conductive layer.

Each of the first conductive layer IS-CL1 and the second conductive layer IS-CL2 includes a plurality of conductive patterns. The conductive patterns may include the touch electrodes and touch signal lines.

Each of the first touch insulating layer IS-IL1 and the second touch insulating layer IS-IL2 may include an inorganic material or an organic material. At least one of the first touch insulating layer IS-IL1 or the second touch insulating layer IS-IL2 may include an inorganic film. The inorganic film may include at least one of aluminum oxide, titanium oxide, silicon oxide, silicon oxynitride, zirconium oxide, or hafnium oxide.

At least one of the first touch insulating layer IS-IL1 or the second touch insulating layer IS-IL2 may include an organic film. The organic film may include at least one of acrylate-based resin, methacrylate-based resin, polyisoprene, vinyl-based resin, epoxy-based resin, urethane-based resin, cellulose-based resin, siloxane-based resin, polyimide-based resin, polyamide-based resin, or perylene-based resin.

As illustrated in FIG. 9, the input sensor ISL may include first touch electrodes TE1-1 to TE1-5, first touch signal lines SL1-1 to SL1-5 respectively connected to the first touch electrodes TE1-1 to TE1-5, second touch electrodes TE2-1 to TE2-4, second touch signal lines SL2-1 to SL2-4 respectively connected to the second touch electrodes TE2-1 to TE2-4, and touch pads IS-PD connected to the first touch signal lines SL1-1 to SL1-5 and the second touch signal lines SL2-1 to SL2-4. The first touch electrodes TE1-1 to TE1-5 and the second touch electrodes TE2-1 to TE2-4 cross each other. The first touch electrodes TE1-1 to TE1-5 are arranged in the first direction DR1 and each have a shape extending in the second direction DR2.

Each of the first touch electrodes TE1-1 to TE1-5 has a first length, and each of the second touch electrodes TE2-1 to TE2-4 has a second length. The first length extends in the second direction DR2, the second length extends in the first direction DR1, and the second length may be greater than the first length. Each of the second touch electrodes TE2-1 to TE2-4 includes more sensing parts than each of the first touch electrodes TE1-1 to TE1-5, so that each of the second touch electrodes TE2-1 to TE2-4 has a greater length than each of the first touch electrodes TE1-1 to TE1-5. The first touch signal lines SL1-1 to SL1-5 are respectively connected to one ends of the first touch electrodes TE1-1 to TE1-5. The second touch signal lines SL2-1 to SL2-4 are respectively connected to ends of the second touch electrodes TE2-1 to TE2-4. In an embodiment of the inventive concept, the first touch signal lines SL1-1 to SL1-5 may also be respectively connected to ends of the first touch electrodes TE1-1 to TE1-5. In an embodiment of the inventive concept, the second touch signal lines SL2-1 to SL2-4 may be respectively connected to only one end of the second touch electrodes TE2-1 to TE2-4.

In an embodiment of the inventive concept, the first touch signal lines SL1-1 to SL1-5, the second touch signal lines SL2-1 to SL2-4, and the touch pads IS-PD may be replaced by a circuit board or the like, which may be separately manufactured to be coupled. In an embodiment of the inventive concept, the touch pads IS-PD may be omitted, and the first touch signal lines SL1-1 to SL1-5 and the second touch signal lines SL2-1 to SL2-4 may be connected to the dummy pads IS-DPD of FIG. 5.

The input sensor ISL may sense an external input in a mutual capacitance method or a self-capacitance method. In one embodiment, the input sensor ISL may include at least one touch insulating layer.

As illustrated in FIG. 9, each of the first touch electrodes TE1-1 to TE1-5 includes first sensing parts SP1 and first connecting parts CP1. Each of the second touch electrodes TE2-1 to TE2-4 includes second sensing parts SP2 and second connecting parts CP2. The first sensing parts SP1 are arranged in the second direction DR2, and the second sensing parts SP2 are arranged in the first direction DR1. Each of the first connecting parts CP1 connects adjacent first sensing parts SP1, and each of the second connecting parts CP2 connects adjacent second sensing parts SP2.

Each of the second touch electrodes TE2-1 to TE2-4, which is longer than each of the first touch electrodes TE1-1 to TE1-5, includes more sensing parts and more connecting parts than each of the first touch electrodes TE1-1 to TE1-5. Accordingly, each of the second touch electrodes TE2-1 to TE2-4 may have a larger boundary surface area than each of the first touch electrodes TE1-1 to TE1-5. In one embodiment, a "boundary surface area" may be a surface area defined by the boundary of each of the touch electrodes. In this embodiment, each of the first sensing parts SP1 and each of the second sensing parts SP2 may have substantially the same boundary surface area. Accordingly, for each of the first touch electrodes TE1-1 to TE1-5 and the second touch electrodes TE2-1 to TE2-4, the boundary surface area may be proportional to the number of sensing parts. The first and second sensing parts SP1 and SP2 may have different boundary surface areas in another embodiment.

FIG. 9 illustrates the first touch electrodes TE1-1 to TE1-5, each of which includes five first sensing parts SP1, and the second touch electrodes TE2-1 to TE2-4, each of which includes six second sensing parts SP2. Two first sensing parts (hereinafter referred to as first half sensing parts) disposed at both ends among the five first sensing parts SP1 may each have a size half a size of each of first sensing parts disposed at the center. Two second sensing parts (hereinafter referred to as second half sensing parts) disposed at both ends among the six second sensing parts SP2 may each have a size half a size of each of second sensing parts disposed at the center. Each of the two first half sensing parts and the two second half sensing parts described above may be treated as one sensing part in calculating a boundary surface area, an opening surface area, and an effective surface area to be described later.

In an embodiment, the capacitance Cb may be formed between the first sensing parts SP1 and/or the second sensing parts SP2 and the second electrode CE of the display panel DP. According to an embodiment of the inventive concept, the inspection module 200 (e.g., see FIG. 2) may inspect the display module 100 (e.g., see FIG. 1) for a defect by properly setting the driving frequency and/or the driving voltage of the first sensing parts SP1 and/or the second sensing parts SP2, and by measuring, on the basis thereof, a value of the capacitance Cb between the first sensing parts SP1 and/or the second sensing parts SP2 and the second electrode CE of the display panel DP. Thus, it is possible to detect whether the power supply of the display module 100 and the stabilization module are connected based on the value of capacitance Cb.

Figure 10A:
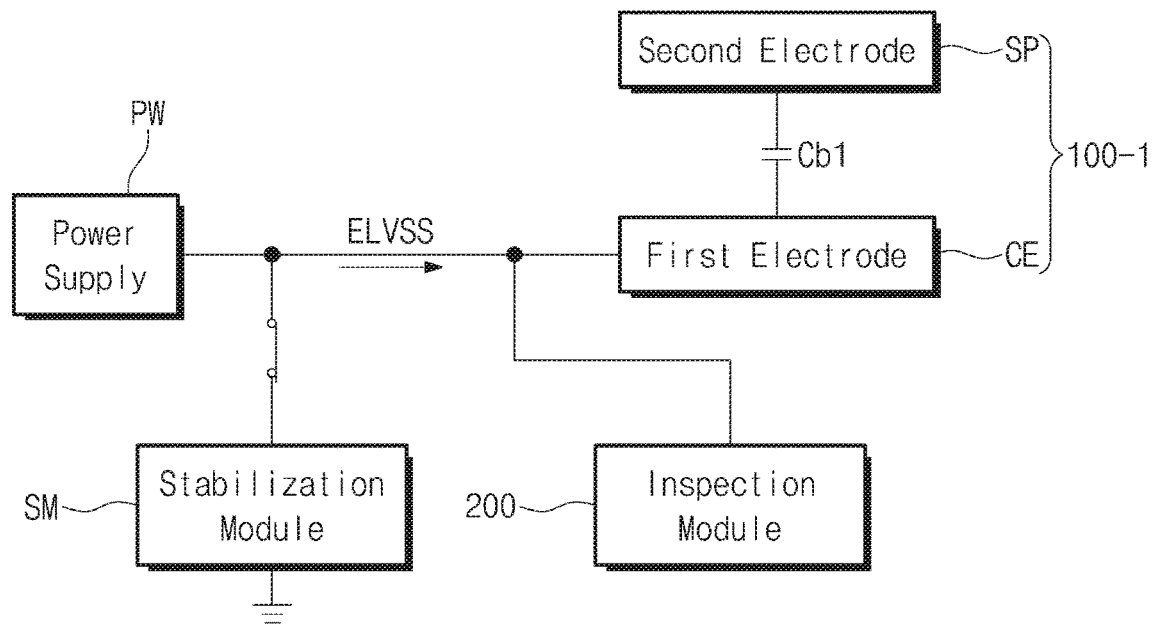
FIGS. 10A and 10B illustrate embodiments of states of a display module.
Figure 10B:
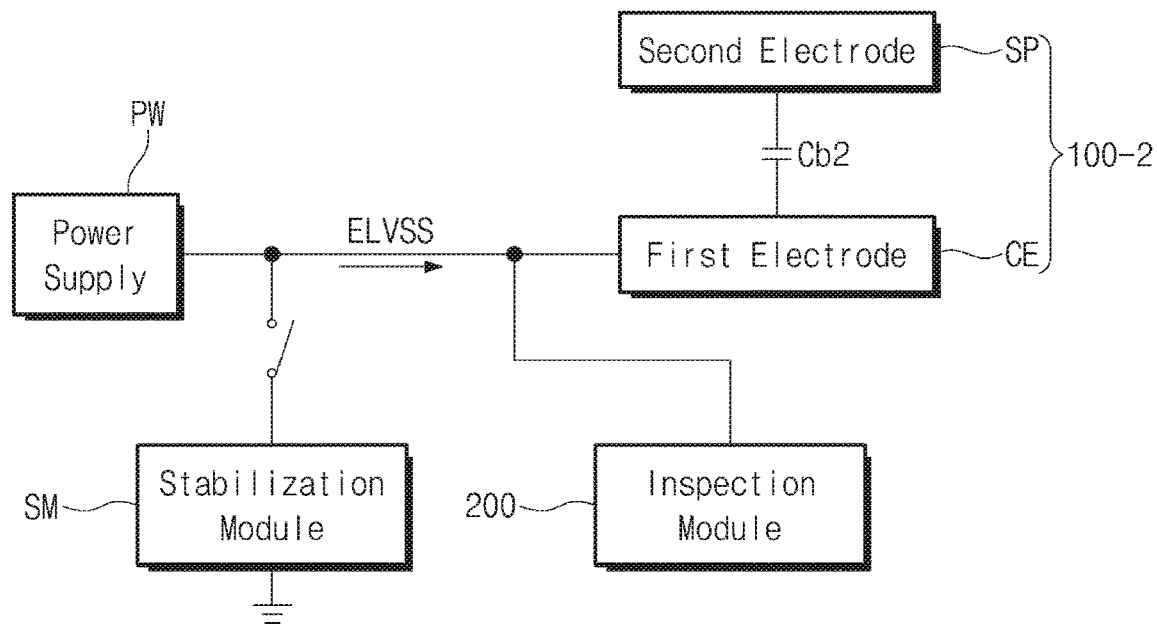

FIGS. 10A and 10B are block diagrams of a display module that is able to assume one of two states according to embodiments of the inventive concept. FIG. 10A illustrates a first state (which will be referred to as a first display module 100-1) to which the stabilization module SM is connected. FIG. 10B illustrates a second state (which will be referred to as a second display module 100-2) to which the stabilization module SM is not connected. Switches shown in FIGS. 10A and 10B are arbitrarily illustrated to indicate whether or not the stabilization module SM is connected. A switch-closed state in FIG. 10A may indicate that the stabilization module SM is attached or electrically connected to the circuit board PCB (e.g., see FIG. 5) and electrically connected to a power supply PW. A switch-open state in FIG. 10B may indicate that the stabilization module SM is removed or electrically disconnected from the circuit board PCB (e.g., see FIG. 5) and electrically disconnected from the power supply PW.

Referring to FIGS. 10A and 10B, the display module inspection device 1000 (e.g., see FIG. 1) according to an embodiment may include a first electrode CE and a second electrode SP of the display modules 100-1 and 100-2. The first electrode CE may correspond to a cathode CE (e.g., second electrode CE of FIG. 7) of the display panel DP. The second electrode SP may correspond to the first sensing part SP1 and/or the second sensing part SP2 of the input sensor ISL (e.g., see FIG. 9).

In an embodiment, the display module inspection device 1000 may include the power supply PW, the stabilization module SM, and the inspection module 200. The power supply PW may provide the voltage ELVSS to the first electrode CE, and may be connected to the first electrode CE of the display panel DP through the circuit board PCB (e.g., see FIG. 5).

The capacitance Cb may be formed between the first electrode CE and the second electrode SP of the input sensor ISL (e.g., see FIG. 7). The input sensor ISL may sense an input on the basis of a value of the formed capacitance Cb. When the value of the capacitance Cb excessively increases, a defect hindering an input by a user's touch from being sensed may occur.

The stabilization module SM and the inspection module 200 may be connected between the power supply PW and the first electrode CE. The stabilization module SM may include the stabilization capacitance. The stabilization module SM stabilizes the value of the capacitance Cb between the first electrode CE and the second electrode SP. The stabilization module SM may be disposed on the circuit board PCB. The inspection module 200 may be connected to the circuit board PCB to inspect operations of the display modules 100-1 and 100-2 and the input sensor ISL.

In FIG. 10A, the stabilization module SM may be electrically connected to the power supply PW and the first display module 100-1 to stabilize the voltage ELVSS from the power supply PW to the first display module 100-1. When the stabilization module SM is electrically connected, the first display module 100-1 may have a first capacitance value Cb1 stabilized by the stabilized voltage ELVSS. For example, the first display module 100-1 corresponds to a normal state.

In FIG. 10B, the stabilization module SM may be electrically disconnected from the power supply PW. For example, FIG. 10B illustrates a state in which the stabilization module SM is not coupled to the power supply PW and the second display module 100-2. A defect of a touch operation may occur in the second display module 100-2 to which the stabilization module SM is not coupled. For example, a problem may occur where the second display module 100-2 is incapable of sensing an input at low luminance, e.g., below a predetermined luminance value. In such a case, the second display module 100-2 may be in a defective state. The second display module 100-2 from which the stabilization module SM is separated may have a second capacitance value Cb2. The second capacitance value Cb2 may be different from (e.g., greater than) the first capacitance value Cb1.

In FIGS. 10A and 10B, the inspection module 200 may determine whether the display module is defective on the basis of the value of the capacitance between the first electrode CE and the second electrode SP. A defective display module may correspond, for example, to the second display module 100-2 in which the stabilization module SM is not electrically connected to the power supply PW and the display module. Accordingly, the inspection unit 230 (e.g., see FIG. 2) of the inspection module 200 may determine the display module as the first display module 100-1 electrically connected to the stabilization module SM when the first capacitance value Cb1 is detected, and may determine the display module as the second display module 100-2 not electrically connected to the stabilization module SM when the second capacitance value Cb2 is detected.

The inspection module 200 may optimally set the driving frequency and/or the driving voltage of the second electrode SP to clearly detect a difference between the first capacitance value Cb1 and the second capacitance value Cb2, used to distinguish between the first display module 100-1 and the second display module 100-2. For example, the frequency setting unit 210 (e.g., see FIG. 2) of the inspection module 200 may set the driving frequency of the second electrode SP to a predetermined frequency range, e.g., a range of about 400 kHz to about 700 kHz, and in one embodiment to about 475 kHz. The driving voltage setting unit 220 (e.g., see FIG. 2) may set the driving voltage to a voltage in a predetermined range, e.g., a range of about 2.7 V to about 3.6 V, and in one embodiment to about 3.6 V.

In one embodiment, an inspection module 200 may set a driving voltage (e.g., voltage ELVSS) of a power supply to a voltage in a predetermined range (e.g., about −1.1 V to about −4.1 V, and in one embodiment to about −1.1 V) to clearly detect a difference between a first capacitance value Cb1 and a second capacitance value Cb2, used to distinguish between a first display module 100-1 and a second display module 100-2. In this case, the difference between the first capacitance value Cb1 and the second capacitance value Cb2 may be clearly seen when the voltage ELVSS is in the range of about −1.1 V to about −4.1 V, and the distinction between the first capacitance value Cb1 and the second capacitance value Cb2 may be clearest when, for example, the voltage ELVSS is about −1.1 V.

The inspection module 200 may clearly distinguish the second display module 100-2 (from which the stabilization module SM is separated) from the first display module 100-1 to which the stabilization module SM is properly coupled, by optimally setting the driving frequency and the driving voltage of the second electrode SP as described above and detecting the first capacitance value Cb1 and the second capacitance value Cb2.

Figure 12:
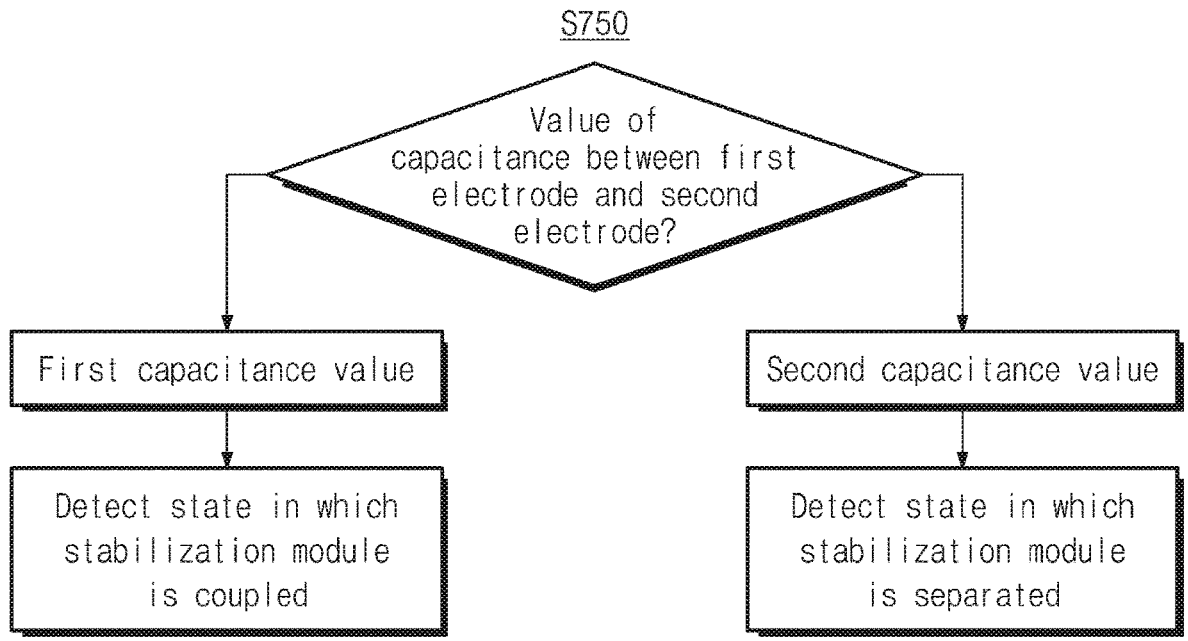
FIG. 12 illustrates an embodiment of a display module inspection method.

FIG. 11 is a flowchart of a display module inspection method according to an embodiment of the inventive concept. FIG. 12 is a flowchart of a display module inspection method according to an embodiment of the inventive concept.

Referring to FIG. 11, the display module inspection method may connect a display module and an inspection module (S710).

The inspection module may set a driving frequency of a second electrode of the display module to a frequency in a predetermined range, e.g., a range of about 400 kHz to about 700 kHz (S720). In an embodiment, the inspection module may set the driving frequency of the second electrode to about 475 kHz.

The inspection module may set a driving voltage of the second electrode of the display module to a voltage in a predetermined range, e.g., a range of about 2.7 V to about 3.6 V (S730). In an embodiment, the inspection module may set the driving voltage of the second electrode to about 3.6 V.

The inspection module may measure a value of capacitance between a first electrode and the second electrode (S740).

The inspection module may determine whether the display module is defective on the basis of the measured value of the capacitance (S750).

FIG. 12 is a flowchart illustrating operation S750 of FIG. 11. In FIG. 12, when the value of the capacitance between the first electrode and the second electrode corresponds to a first capacitance value, the inspection module may detect a normal state in which a stabilization module is properly coupled to a circuit board and electrically connected to the display module. On the other hand, when the value of the capacitance between the first electrode and the second electrode corresponds to a second capacitance value, the inspection module may detect a defective state in which the stabilization module is separated from the circuit board and electrically disconnected from the display module.

FIG. 13 to FIG. 16 are graphs showing example effects according to an embodiment of the inventive concept. FIGS. 13 to 16 show differences between the first capacitance value Cb1 and the second capacitance value Cb2 according to the driving frequency and/or the driving voltage of the second electrode SP (e.g., see FIG. 10A) set by the inspection module 200.

Figure 13:
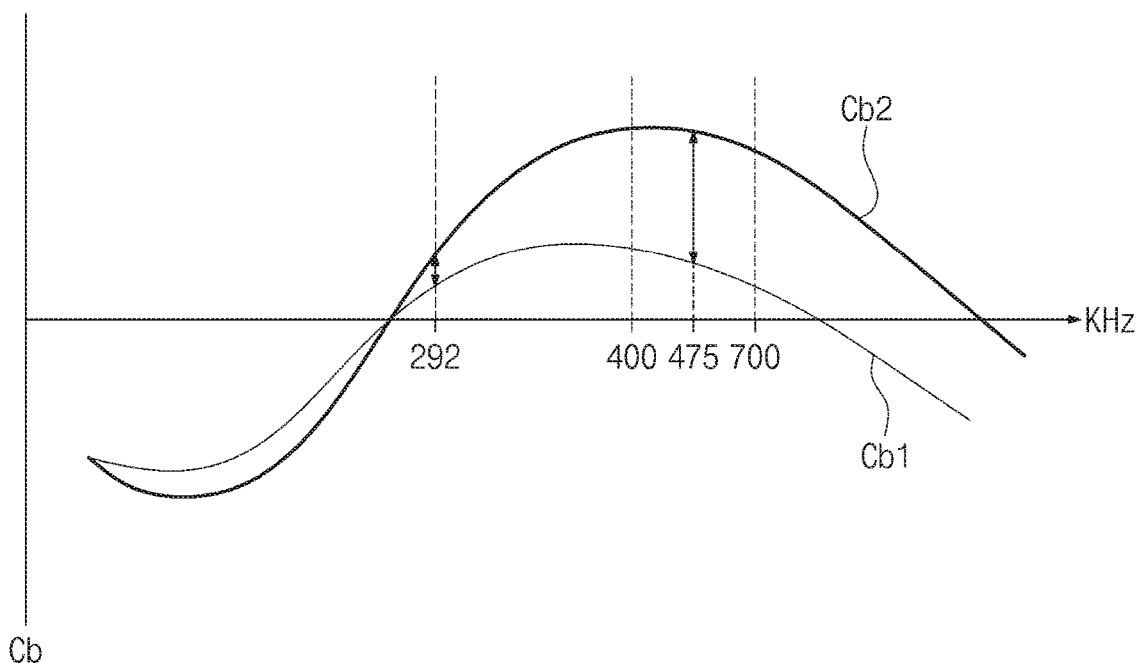
FIGS. 13 to 16 illustrate effects according to embodiments of the inventive concept.

FIG. 13 is a graph showing an example value of the capacitance according to setting of the driving frequency of the second electrode SP (e.g., see FIG. 10A) of the input sensor of an embodiment of the inventive concept. In FIG. 13, the vertical axis corresponds to the value of the capacitance Cb, horizontal axis corresponds to the driving frequency of the second electrode SP (see FIG. 10A).

Referring to FIG. 13, it may be seen that the difference between the first capacitance value Cb1 and the second capacitance value Cb2 varies according to the driving frequency. For example, the difference between the first capacitance value Cb1 and the second capacitance value Cb2 is smaller when the driving frequency is about 292 kHz than when the driving frequency is about 475 kHz. In FIG. 13, it may be seen that the difference between the first capacitance value Cb1 and the second capacitance value Cb2 is clear when the driving frequency has a value in a range of about 400 kHz to about 700 kHz.

Figure 14:
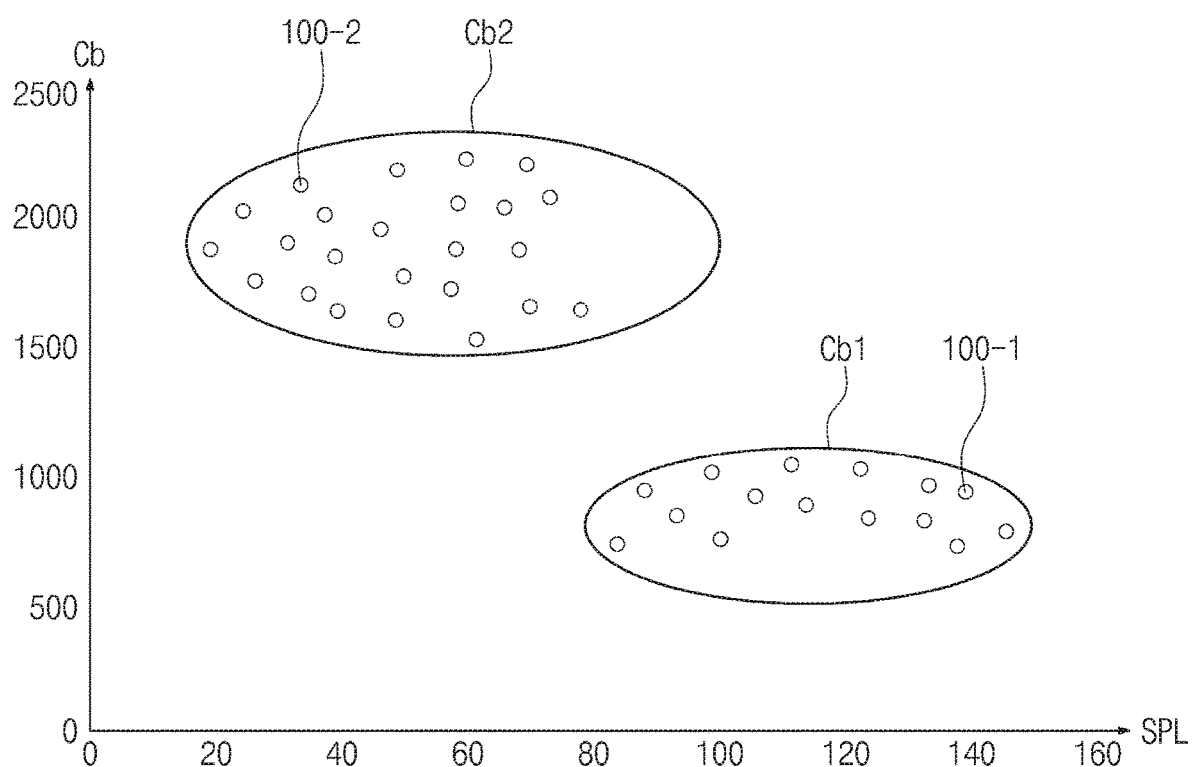

FIG. 14 is a graph showing example values of the capacitance for a plurality of samples when the driving frequency of the second electrode SP (e.g., see FIG. 10A) is set to about 475 kHz. In FIG. 14, the vertical axis corresponds to the value of the capacitance Cb, and the horizontal axis corresponds to a plurality of samples SPL. The plurality of samples SPL correspond to a plurality of display modules different from each other, some of which have the stabilization module SM (e.g., see FIG. 10A) connected thereto and have the first capacitance value Cb1. Others have the stabilization module SM disconnected therefrom and have the second capacitance value Cb2.

Referring to FIG. 14, it may be seen that samples SPL having the first capacitance value Cb1 and samples SPL having the second capacitance value Cb2 are separated from each other. For example, the first capacitance value Cb1 may be distributed in a range of about 500 to about 1300, and the second capacitance value Cb2 may be distributed in a range of about 1500 to about 2500.

Accordingly, the first capacitance value Cb1 and the second capacitance value Cb2 are clearly distinguished, so that the first display module 100-1 (e.g., see FIG. 10A) and the second display module 100-2 (e.g., see FIG. 10B) may be clearly distinguished and detected. Thus, because a maximum value of the first capacitance value Cb1 and a minimum value of the second capacitance value Cb2 have a difference of about 200, the first display module 100-1 and the second display module 100-2 may be clearly distinguished and detected without overlapping in terms of the value of capacitance.

Figure 15:
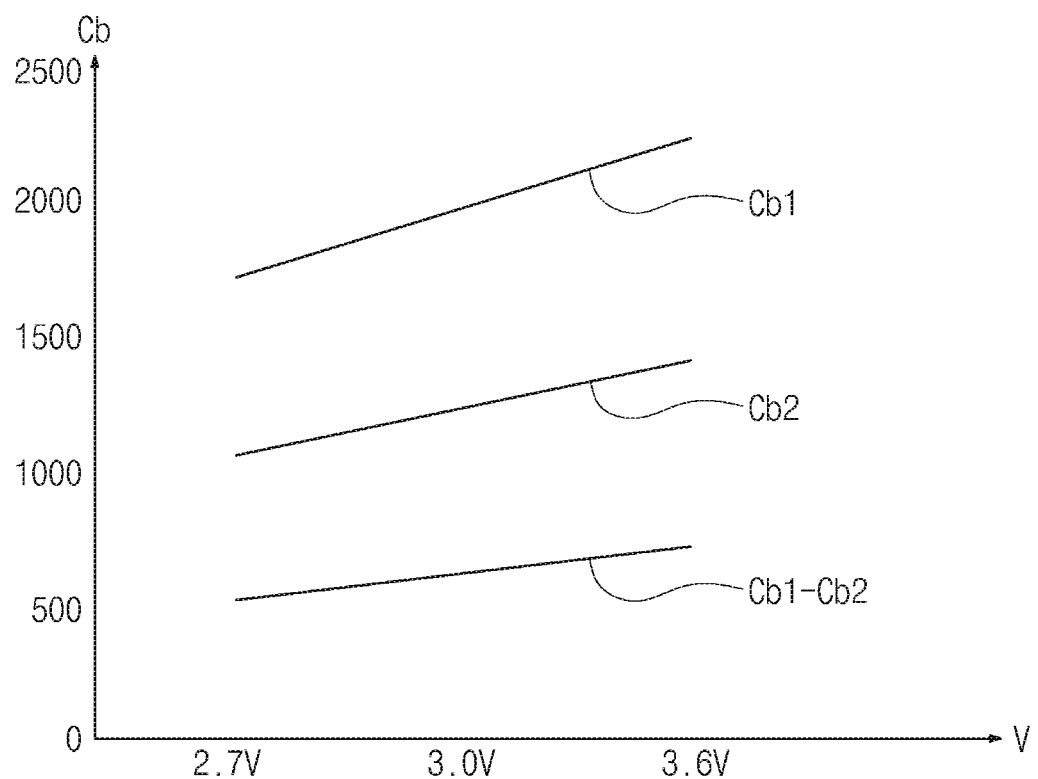

FIG. 15 is a graph showing an example difference between the first capacitance value and the second capacitance value according to the driving voltage of the second electrode SP (e.g., see FIG. 10A). In FIG. 15, it may be seen that as the driving voltage increases, the first capacitance value Cb1, the second capacitance value Cb2, and a difference Cb1−Cb2 between the first capacitance value and the second capacitance value increase. For example, not only each of the first capacitance value Cb1 and the second capacitance value Cb2 but also the difference Cb1−Cb2 between the first capacitance value and the second capacitance value may be greater when the driving voltage is about 3.6 V than when the driving voltage is about 2.7 V. Accordingly, when the driving voltage is about 3.6 V, the first capacitance value Cb1 and the second capacitance value Cb2 may be more clearly distinguished.

Figure 16:
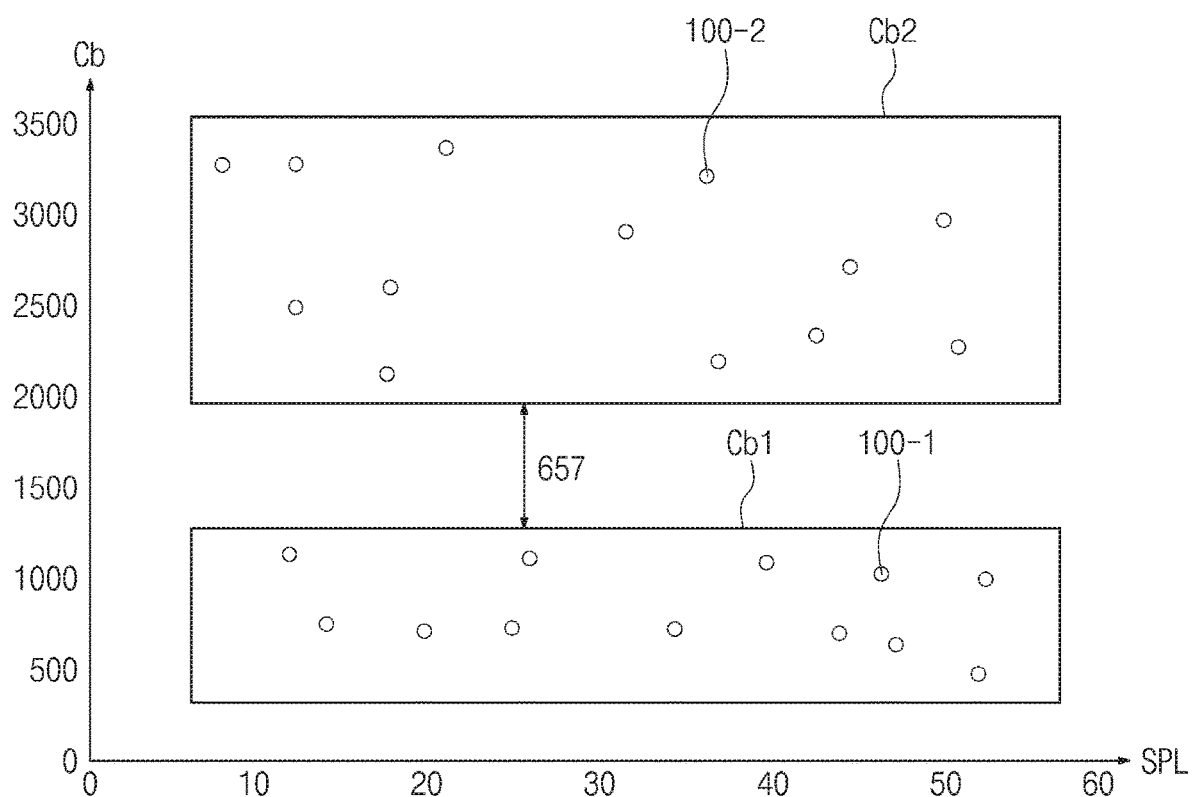

FIG. 16 is a graph showing an example difference between the first capacitance value and the second capacitance value when the driving frequency of the second electrode SP is set to about 475 kHz and at substantially the same time, the driving voltage thereof is set to about 3.6 V. The driving voltage and the driving frequency are optimally set in FIG. 16, whereas only the driving frequency is optimally set in FIG. 14. Accordingly, it may be seen that a difference between the maximum value of the first capacitance value Cb1 and the minimum value of the second capacitance value Cb2 of FIG. 16 is clearer than that of FIG. 14.

Also, in FIG. 16, it may be seen that there is a difference of about 657 between the maximum value in a distribution range of the first capacitance value Cb1 for the first display module 100-1 to which the stabilization module SM (e.g., see FIG. 10A) is attached and the minimum value in a distribution range of the second capacitance value Cb2 for the second display module 100-2 (e.g., see FIG. 10B) to which the stabilization module SM is not attached. Thus, when the driving voltage and the driving frequency of the second electrode of the display module are optimally set, the first display module 100-1 and the second display module 100-2 are more easily distinguished and detected.

As may be seen in FIGS. 13 to 16, the inspection module 200 according to an embodiment of the inventive concept may clearly detect whether the stabilization module SM (e.g., see FIG. 10A) of the display module 100 is coupled (or connected), by optimally setting the driving frequency and the driving voltage of the second electrode SP (e.g., see FIG. 10A) included in the input sensor ISL of the display module 100 (e.g., see FIG. 4). The inspection module 200 may inspect the display module for a defect by detecting whether the stabilization module SM is coupled.

The display module inspection device and the display module inspection method according to an embodiment of the inventive concept may inspect the display module for defects by detecting whether the stabilization module is coupled.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device to a special-purpose processor to perform the methods herein.

Also, another embodiment may include a computer-readable medium, e.g., a non-transitory computer-readable medium, for storing the code or instructions described above. The computer-readable medium may be a volatile or non-volatile memory or other storage device, which may be removably or fixedly coupled to the computer, processor, controller, or other signal processing device which is to execute the code or instructions for performing the method embodiments or operations of the apparatus embodiments herein.

The controllers, processors, devices, modules, setters, units, multiplexers, generators, logic, interfaces, decoders, drivers, generators and other signal generating and signal processing features of the embodiments disclosed herein may be implemented, for example, in non-transitory logic that may include hardware, software, or both. When implemented at least partially in hardware, the controllers, processors, devices, modules, setters, units, multiplexers, generators, logic, interfaces, decoders, drivers, generators and other signal generating and signal processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the controllers, processors, devices, modules, setters, units, multiplexers, generators, logic, interfaces, decoders, drivers, generators and other signal generating and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

As described above, the embodiments have been disclosed in the figures and specification. Although specific terms are employed herein, the terms are used only for the purpose of describing the inventive concept and are not used to limit the scope of the inventive concept as defined in the claims. Accordingly, it is understood that various changes and modifications can be made by those skilled in the art within the spirit and scope of the inventive concept. Therefore, the scope of the inventive concept is defined by technical spirit within the scope of the following claims or the equivalents. The embodiments may be combined to form additional embodiments.

What is claimed is:

1. An inspection device, comprising:
a display including a power supply, a circuit board having a stabilizer configured to stabilize the power supply, a display panel which is electrically connected to the circuit board and has a first electrode, and an input sensor which is disposed on the display panel and has a second electrode; and
inspection logic configured to measure a value of capacitance between the first electrode and the second electrode of the display, wherein the inspection logic comprises a frequency setter configured to set a driving frequency of the second electrode to a frequency in a first predetermined range.

2. The inspection device of claim 1, wherein the input sensor is directly disposed on the display panel.

3. The inspection device of claim 1, wherein the first predetermined range is about 400 kHz to about 700 kHz.

4. The inspection device of claim 1, wherein the frequency in the first predetermined range is about 475 kHz.

5. The inspection device of claim 1, wherein the inspection logic comprises a driving voltage setter configured to set a driving voltage of the second electrode to a voltage in a second predetermined range.

6. The inspection device of claim 5, wherein the second predetermined range is about 2.7 V to about 3.6 V.

7. The inspection device of claim 5, wherein the voltage in the second predetermined range is about 3.6 V.

8. The inspection device of claim 1, wherein the display is in one of at least two states:
a first state in which the stabilizer is electrically connected to the power supply; or
a second state in which the stabilizer is not electrically connected to the power supply.

9. The inspection device of claim 8, wherein:
the value of the capacitance comprises one of a first capacitance value or a second capacitance value greater than the first capacitance value,
the inspection logic is configured to determine that the display is in the first state when the measured value of the capacitance has the first capacitance value and is configured to determine the display is in the second state when the measured value of the capacitance has the second capacitance value.

10. The inspection device of claim 9, wherein a minimum value of the second capacitance value is greater than a maximum value of the first capacitance value.

11. The inspection device of claim 1, wherein the inspection logic is configured to determine a defect in operation of the input sensor based on the measured value of the capacitance.

12. The inspection device of claim 11, wherein the inspection logic is configured to determine that the stabilizer is disconnected to the power supply based on the measured value of the capacitance, and wherein disconnection of the stabilizer corresponds to the defect in operation of the input sensor.

13. The inspection device of claim 11, wherein the driving frequency is set by the inspection logic to detect disconnection of the stabilizer.

14. An inspection device, comprising:
a display including a power supply, a circuit board having a stabilizer configured to stabilize the power supply, a display panel which is electrically connected to the circuit board and has a first electrode, and an input sensor which is disposed on the display panel and has a second electrode; and
inspection logic configured to measure a value of capacitance between the first electrode and the second electrode of the display, wherein the inspection logic is configured to set a driving voltage of the power supply to a voltage in a first predetermined range.

15. The inspection device of claim 14, wherein the first predetermined range is about −1.1 V to about −4.1 V.

16. The inspection device of claim 14, wherein the inspection logic is configured to determine the defect in operation of the input sensor based on the measured value of the capacitance.

17. The inspection device of claim 16, wherein the inspection logic is configured to determine that the stabilizer is disconnected to the power supply based on the measured value of the capacitance, and wherein disconnection of the stabilizer corresponds to the defect in operation of the input sensor.

18. The inspection device of claim 16, wherein the driving voltage is set by the inspection logic to detect disconnection of the stabilizer.

19. An inspection method, comprising:
providing a display including a power supply, a circuit board having a stabilizer configured to stabilize the power supply, a display panel which is electrically connected to the circuit board and has a first electrode, and an input sensor which is disposed on the display panel and has a second electrode;
setting, by inspection logic, a driving frequency of the second electrode to a frequency in a first predetermined range; and
measuring, by the inspection logic, a value of capacitance between the first electrode and the second electrode.

20. The inspection method of claim 19, wherein the first predetermined range is about 400 kHz to about 700 kHz.

21. The inspection method of claim 19, wherein the input sensor is directly disposed on the display panel.

22. The inspection method of claim 19, wherein the frequency in the first predetermined range is about 475 kHz.

23. The inspection method of claim 19, further comprising:
setting, by the inspection logic, a driving voltage of the second electrode to a voltage in a second predetermined range.

24. The inspection method of claim 23, wherein the second predetermined range is about 2.7 V to about 3.6 V.

25. The inspection method of claim 23, wherein the driving voltage is about 3.6 V.

26. The inspection method of claim 19, wherein the display is in one of at least two states:
a first state in which the stabilizer is electrically connected to the power supply; or
a second state in which the stabilizer is not electrically connected to the power supply.

27. The inspection method of claim 26, wherein measuring, by the inspection logic, the value of the capacitance between the first electrode and the second electrode comprises:
determining the display is in the first state when the measured value of the capacitance has a first capacitance value, and
determining the display is in the second state when the measured value of the capacitance has a second capacitance value.

28. The inspection method of claim 27, wherein a maximum value of the first capacitance value is less than a minimum value of the second capacitance value.

29. An apparatus, comprising:
inspection logic configured to determine existence of a defect in a display, the display including a power supply, a circuit board having a stabilizer configured to stabilize the power supply, a display panel which is electrically connected to the circuit board and has a first electrode, and an input sensor which is disposed on the display panel and has a second electrode,
wherein the inspection logic comprises a frequency setter configured to set a driving frequency of the second electrode to a frequency in a first predetermined range, and wherein the inspection logic is configured to measure a value of capacitance between the first electrode and the second electrode of the display to determine existence of the defect.

* * * * *